United States Patent
Takahashi et al.

(10) Patent No.: US 7,661,996 B2
(45) Date of Patent: Feb. 16, 2010

(54) ELECTRICAL CONNECTION TERMINAL FOR CONNECTION HOLE AND ENGAGEMENT STRUCTURE OF ELECTRONIC COMPONENT INCLUDING THE SAME

(75) Inventors: Shinji Takahashi, Aichi (JP); Yoshiaki Kato, Aichi (JP); Harehide Sasaki, Aichi (JP); Hiroshi Kobayashi, Okazaki (JP)

(73) Assignee: Kabushiki Kaisha Tokai Rika Denki Seisakusho, Aichi (JP)

( * ) Notice: Subject to any disclaimer, the term of this patent is extended or adjusted under 35 U.S.C. 154(b) by 0 days.

(21) Appl. No.: 12/118,125

(22) Filed: May 9, 2008

(65) Prior Publication Data

US 2008/0280504 A1 Nov. 13, 2008

(30) Foreign Application Priority Data

May 10, 2007 (JP) .............................. 2007-125443

(51) Int. Cl.
 *H01R 13/428* (2006.01)
(52) U.S. Cl. .................................................... 439/744
(58) Field of Classification Search ................. 439/744, 439/567, 552–555, 329, 571, 573, 78, 79
 See application file for complete search history.

(56) References Cited

U.S. PATENT DOCUMENTS 4,857,019 A 8/1989 Brubaker et al.
5,520,551 A * 5/1996 Broschard, III ............. 439/567
5,944,563 A 8/1999 Nagafuji
6,123,580 A * 9/2000 Bendorf et al. ............. 439/567
6,231,402 B1 5/2001 Kikuchi
6,733,334 B2 * 5/2004 Chen .......................... 439/554

FOREIGN PATENT DOCUMENTS

| JP | 5-80793 | 11/1993 |
| JP | 7-22058 | 5/1995 |
| JP | 8-69828 | 3/1996 |
| JP | 11-297385 | 10/1999 |
| JP | 2000-133352 | 5/2000 |
| JP | 2000-299250 | 10/2000 |

* cited by examiner

*Primary Examiner*—Jean F Duverne
(74) *Attorney, Agent, or Firm*—Scully, Scott, Murphy & Presser, P.C.

(57) ABSTRACT

An electrical connection terminal for a connection hole includes: a base-side end portion (310) having a predetermined width; a retaining portion (313) having an increasing width wider than the predetermined width of the base-side end portion (310), the retaining portion (313) being formed integrally with the base-side end portion (310); and an insertion taper portion (315) having a taper width narrower than the increasing width of the retaining portion (313) to reach a leading end portion, the insertion taper portion (315) being formed integrally with the retaining portion (313); in which the insertion taper portion (315) is composed of a plurality of taper portions taper angles of which change so as to increase along an insertion direction.

15 Claims, 6 Drawing Sheets

ELECTRICAL CONNECTION TERMINAL FOR CONNECTION HOLE AND ENGAGEMENT STRUCTURE OF ELECTRONIC COMPONENT INCLUDING THE SAME

The present application is based on Japanese Patent Application No. 2007-125443 filed on May 10, 2007, the entire contents of which are incorporated herein by reference.

BACKGROUND OF THE INVENTION

1. Field of the Invention

The present invention relates to an electrical connection terminal for a connection hole and an engagement structure of an electronic component including the same, and more particularly to an electrical connection terminal for a connection hole which is inserted through a connection hole, and an engagement structure of an electronic component including the same.

2. Description of the Related Art

An engagement structure of an electronic component with which leads of an electronic component with leads are inserted into (through) through holes of a circuit board with through holes, respectively, to engage the electronic component with leads with the circuit board, for example, is known as conventional one in this technical field. This technique, for example, is described in Japanese Patent Laid-Open No. 2000-299250.

This engagement structure of an electronic component includes a printed-wiring board as a circuit board, and an electronic component which is engaged with the printed-wiring board.

The printed-wiring board has at least one pair of through holes which are formed in parallel at predetermined intervals. The electronic component has leads including claw portions which are inserted through the at least one pair of through holes, respectively.

In order to engage the electronic component with the printed-wiring board by using the structure described above, the engagement of the electronic component with the printed-wiring board is performed in such a way that by using an automatic inserting machine, the electronic component is moved and the leads of the electronic component are inserted through the at least one pair of through holes, respectively, from a surface side (from a component mounting surface side) of the printed-wiring board previously placed on a stage. In this case, when the leads of the electronic component are inserted through the at least one pair of through holes, respectively, the claw portions of the leads are engaged with back surface-side opening peripheries of the through holes, respectively. After that, the claw portions of the leads are soft-soldered to the back surface-side opening peripheries (lands) of the through holes, respectively, thereby mounting the electronic component to the circuit board.

In this sort of engagement structure of an electronic component, normally, as shown in FIG. 6, a guide surface (insertion taper surface) 602 having a predetermined lead insertion angle (taper angle) a is formed in a claw portion 601 of a lead 600. Here, the lead insertion angle α means an angle by which the guide surface 602 is inclined with respect to a lead insertion direction (an angle which a side surface 603 and the guide surface 602 make with each other).

This technique, for example, is described in Japanese Patent Publication No. 05-80793, Japanese Patent Laid-Open Nos. 11-297385, 08-69828 and 2001-133352, and Japanese Utility Model Publication No. 07-22058 in addition to Japanese Patent Laid-Open No. 2000-299250.

However, in the case of the conventional engagement structure of an electronic component (refer to Japanese Patent Laid-Open No. 2000-299250), the lead insertion angle α of the guide surface 6002 in the lead 600 is set as single one. For this reason, the conventional engagement structure of an electronic component involves such a problem that when the lead 600 is inserted into the through hole and is then moved in the lead insertion direction, an amount of deflection of the lead 600 increases in correspondence to a movement distance of the lead 600, and thus a lead insertion force gradually increases for a period of time from start of the insertion of the lead into the through hole to end of the insertion of the lead through the through hole.

For this reason, there has been desired the appearance of an engagement structure of an electronic component which is capable of inserting a lead into a through hole by using a lead insertion force held equal to or smaller than a predetermined value (10N) for a period of time from start of insertion of the lead into the through hole to end of the insertion of the lead through the through hole, thereby engaging an electronic component with a circuit board.

SUMMARY OF THE INVENTION

The invention has been made in the light of the circumstances described above, and it is therefore an object of the invention to provide an electrical connection terminal for a connection hole and an engagement structure of an electronic component including the same each of which is capable of inserting a lead (an electrical connection terminal for a connection hole) into a through hole (connection hole) by using a lead insertion force held equal to or smaller than a predetermined value for a period of time from start of insertion of the lead into the through hole to end of the insertion of the lead through the through hole.

In order to attain the object described above, according to the invention, there is provided an electrical connection terminal for a connection hole, including: a base-side end portion having a predetermined width; a retaining portion having an increasing width wider than the predetermined width of the base-side end portion, the retaining portion being formed integrally with the base-side end portion; and an insertion taper portion having a decreasing width narrower than the increasing width of the retaining portion to reach a leading end portion, the insertion taper portion being formed integrally with the retaining portion; in which the insertion taper portion is composed of a plurality of taper portions taper angles of which change so as to increase along an insertion direction.

According to the invention, there is provided an engagement structure on an electronic component including a circuit board having a connection hole, and an electronic component having an electrical connection terminal for a connection hole which is inserted through the connection hole, the electrical connection terminal for a connection hole being caused to undergo a deflection to be inserted through the connection hole, thereby engaging the electrical terminal for a connection hole with the circuit board, the electrical connection terminal for a connection hole including: a base-side end portion having a predetermined width; a retaining portion having an increasing width wider than the predetermined width of the base-side end portion, the retaining portion being formed integrally with the base-side end portion; and an insertion taper portion having a decreasing width narrower leading end portion, the insertion taper portion being formed integrally with the retaining portion; in which the insertion taper portion is composed of a plurality of taper portions taper angles of which change so as to increase along an insertion direction.

According to the invention, there is provided an engagement structure of an electronic component including a circuit board having a through hole, and an electronic component having an electrical connection terminal for a through hole which is inserted through the through hole, the electrical connection terminal for a through hole being caused to undergo a deflection to be inserted through the through hole, thereby engaging the electrical connection terminal for a through hole with the circuit board, the electrical connection terminal for a through hole including: a base-side end portion having a predetermined width; a retaining portion having an increasing width wider than the predetermined width of the base-side end portion, the retaining portion being formed integrally with the base-side end portion; and an insertion taper portion having a decreasing width narrower than the increasing width of the retaining portion to reach a leading end portion, the insertion taper portion being formed integrally with the retaining portion; in which the insertion taper portion is composed of a plurality of taper portions taper angles of which change so as to increase along an insertion direction.

According to the invention, the electrical connection terminal for a connection hole can be inserted through the connection hole by using an insertion force held equal to or smaller than a predetermined value for a period of time from start of the insertion of the electrical connection terminal into the connection hole to end of the insertion of the electrical connection terminal through the connection hole.

DETAILED DESCRIPTION OF PREFERRED EMBODIMENT

Embodiment

Figure 1A:
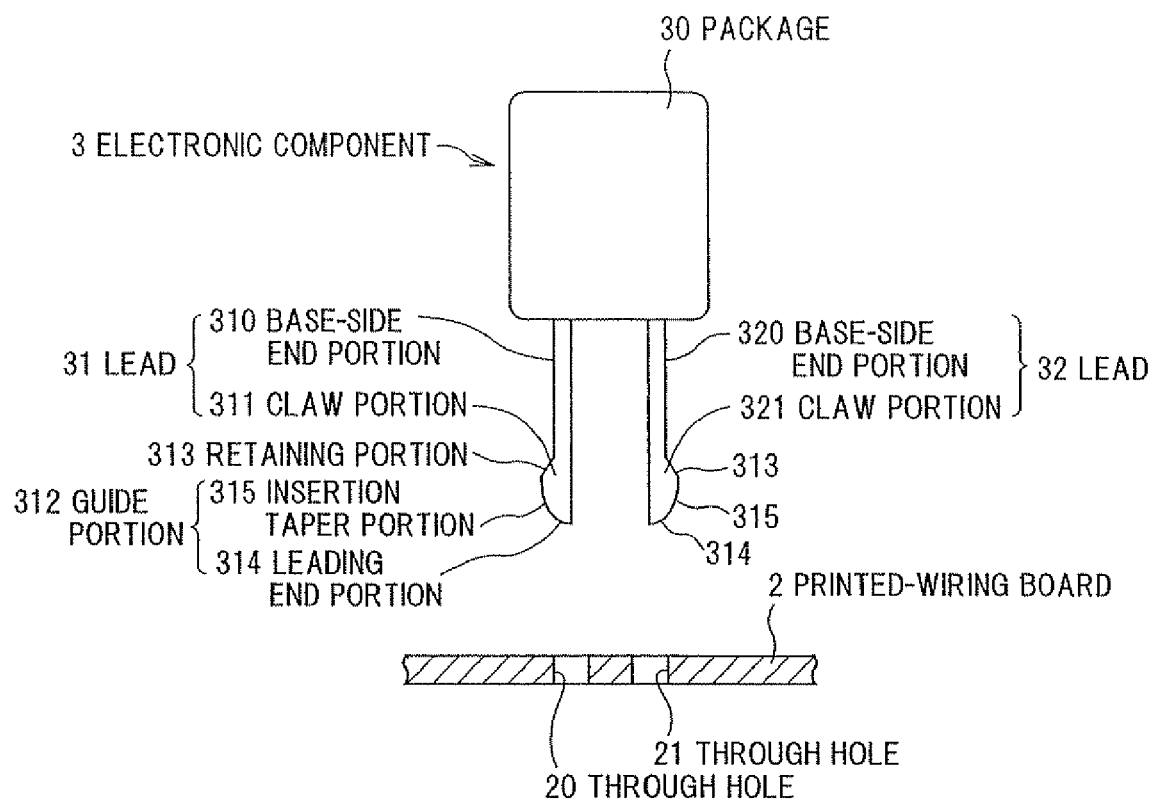
FIGS. 1A and 1B are respectively cross sectional views each explaining an engagement structure of an electronic component according to an embodiment of the invention.
Figure 1B:
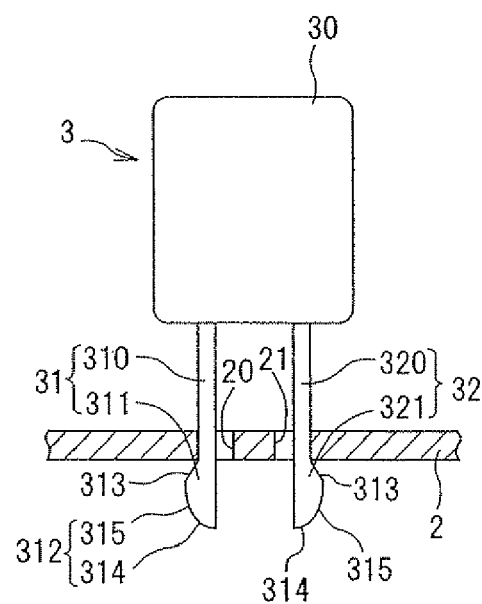
Figure 2A:
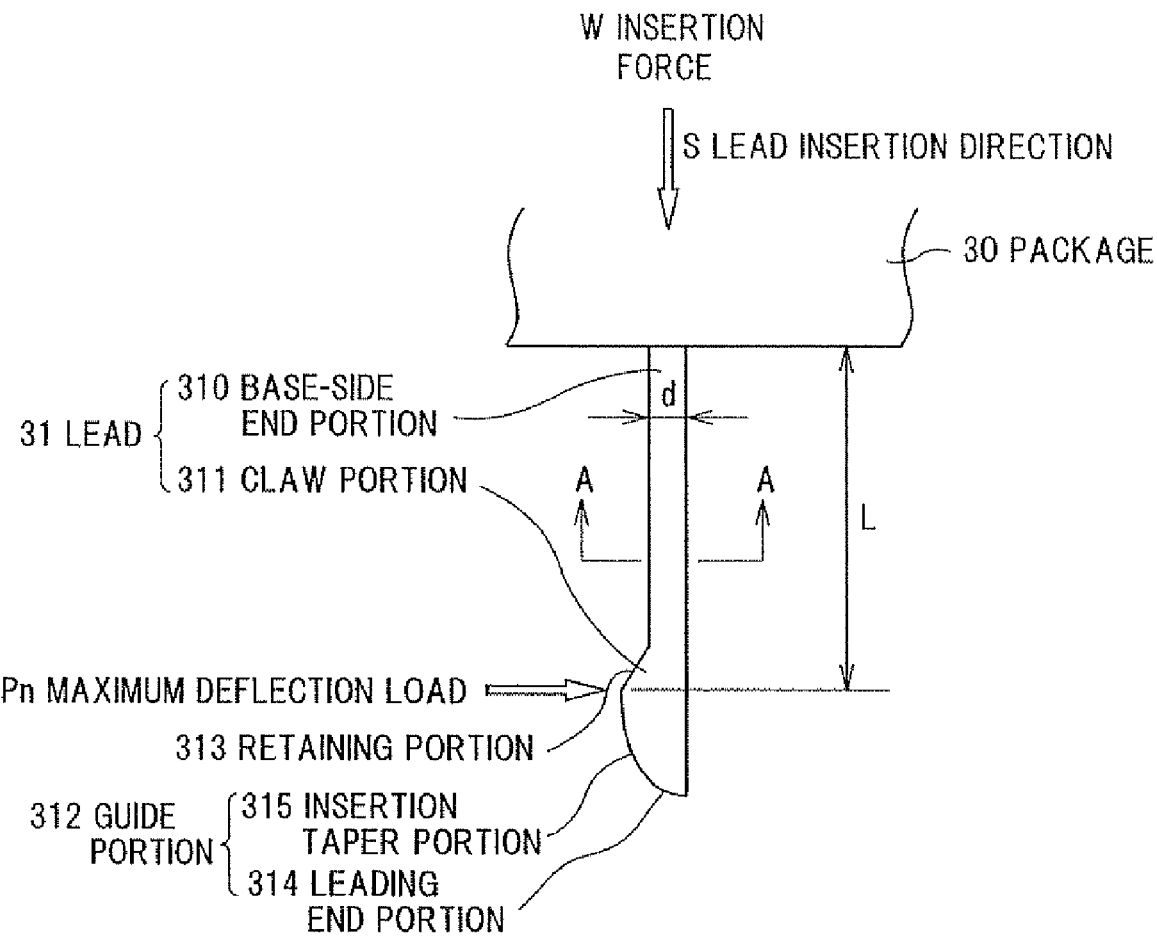
FIGS. 2A and 2B are respectively a front view showing a lead in the engagement structure of an electronic component according to the embodiment of the invention, and a cross sectional view taken on line A-A of FIG. 2A.
Figure 2B:
Figure 3:
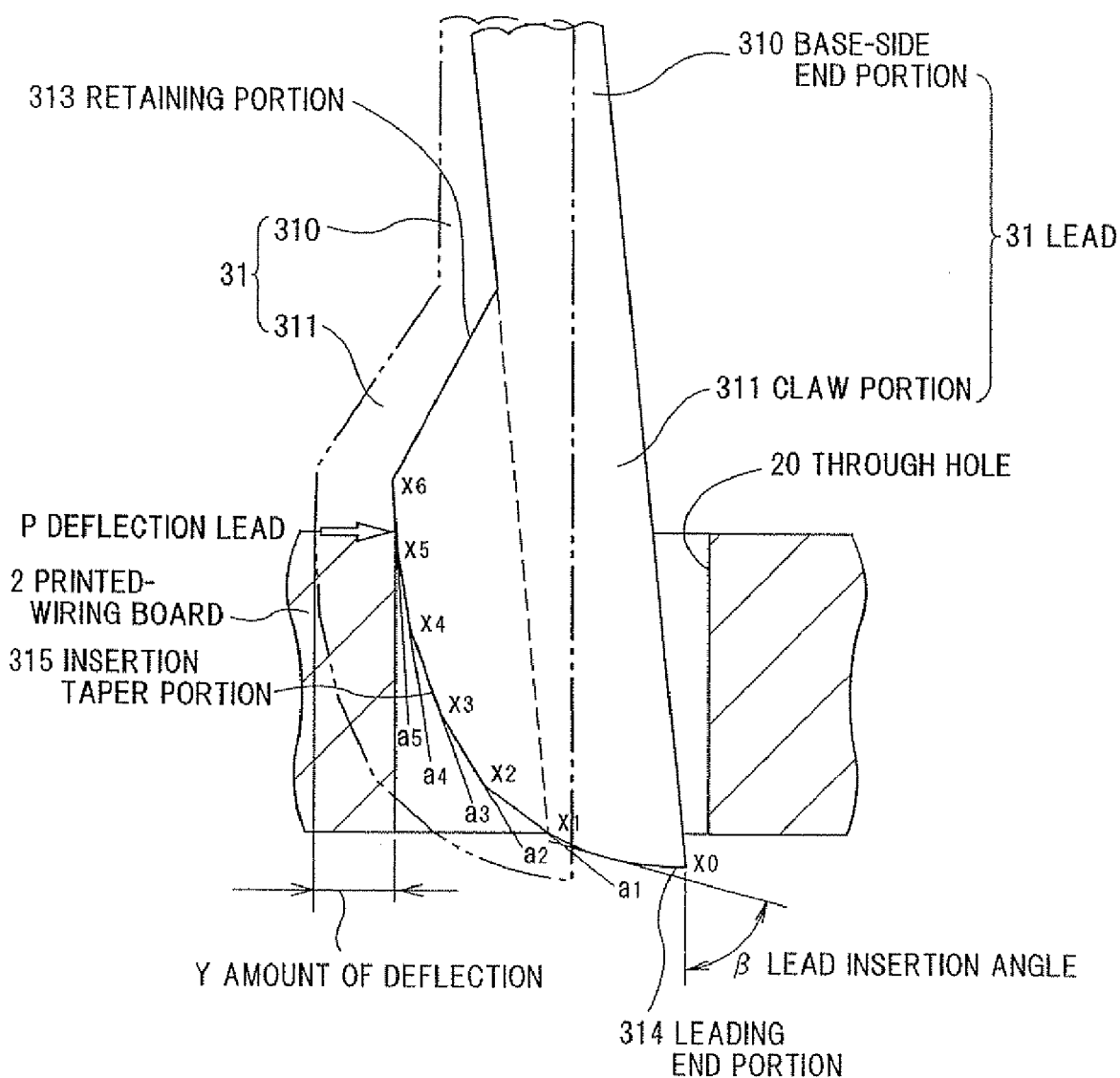
FIG. 3 is a cross sectional view showing a state (1) in progress of inserting the lead in the engagement structure of an electronic component according to the embodiment of the invention.
Figure 4:
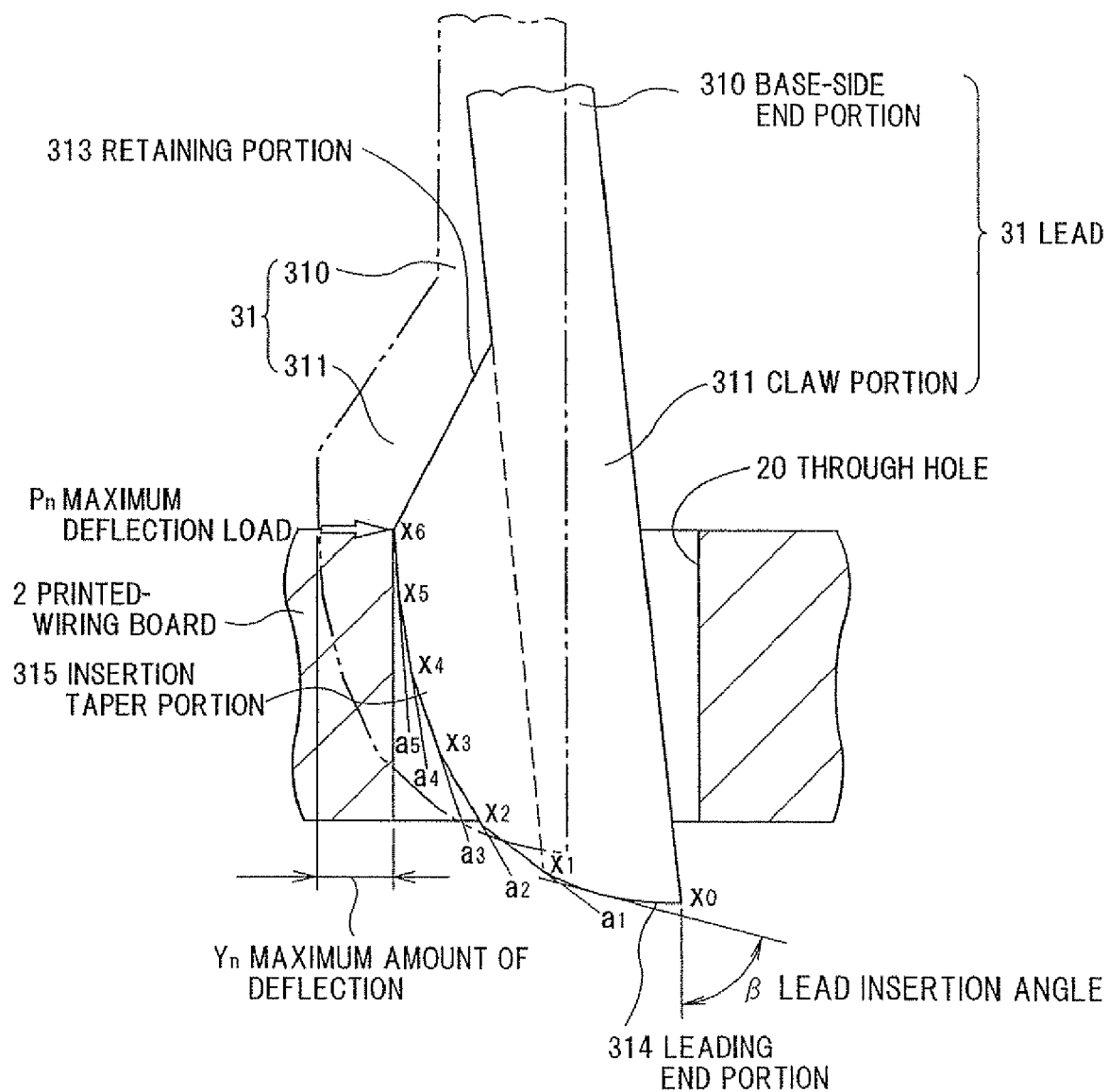
FIG. 4 is a cross sectional view showing a state (2) in progress of inserting the lead in the engagement structure of an electronic component according to the embodiment of the invention.
Figure 5:
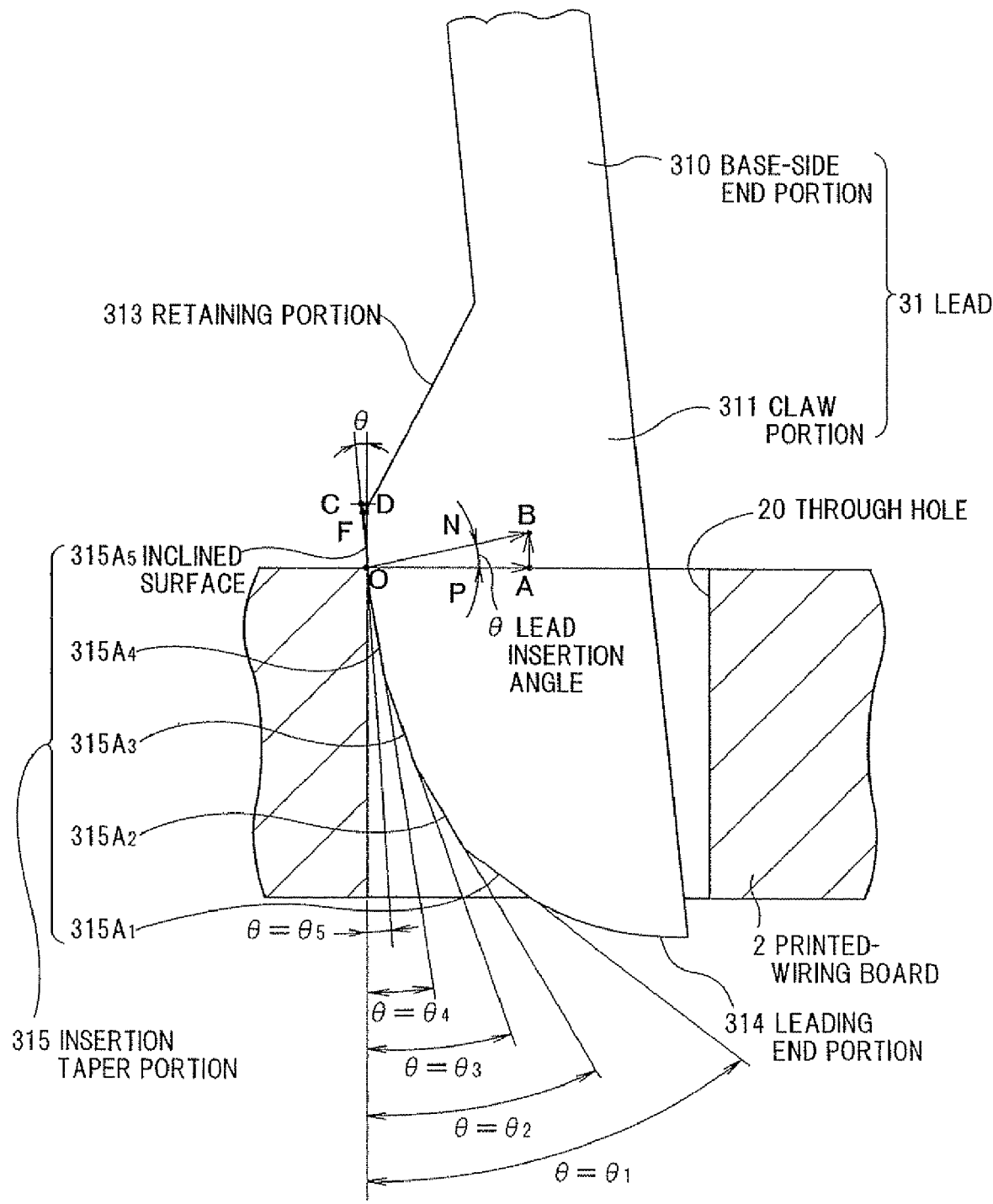
FIG. 5 is a front view explaining a method of obtaining a lead insertion angle of the lead in the engagement structure of an electronic component according to the embodiment of the invention.
Figure 6:
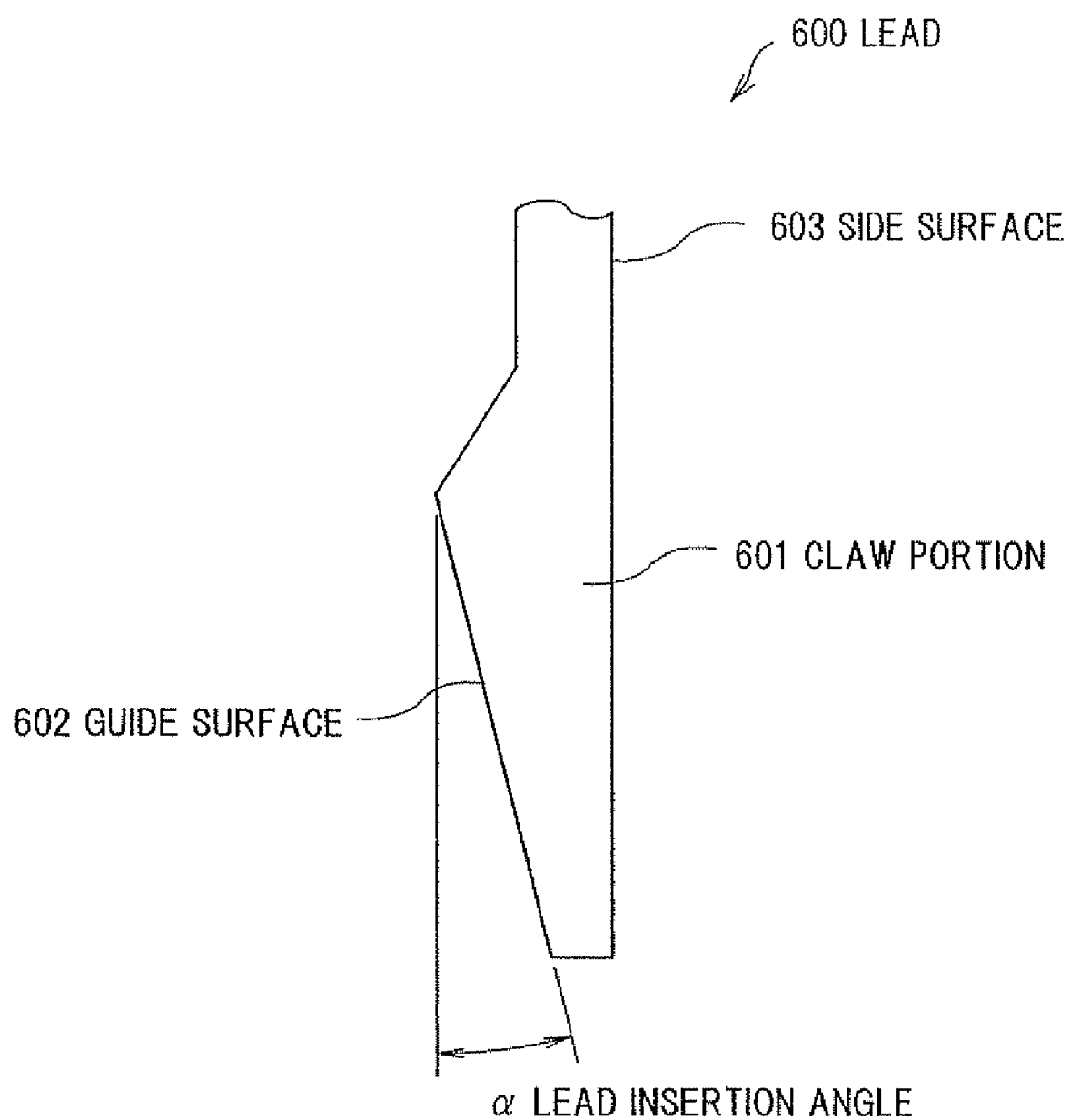
FIG. 6 is an enlarged front view showing a claw portion of a lead in a conventional electronic component.

FIGS. 1A and 1B are respectively cross sectional views each explaining an engagement structure of an electronic component according to an embodiment of the invention. Here, FIG. 1A shows a state before engagement of the electronic component, and FIG. 1B shows a state after the engagement of the electronic component. FIGS. 2A and 23 are respectively views each showing a lead in the engagement structure of an electronic component according to the embodiment of the invention. Here, FIG. 2A shows a front view, and FIG. 2B shows a cross sectional view taken on line A-A of FIG. 2A. FIG. 3 is a cross sectional view showing a state (1) in progress of inserting the lead in the engagement structure of an electronic component according to the embodiment of the invention. FIG. 4 is a cross sectional view showing a state (2) in progress of inserting the lead in the engagement structure of an electronic component according to the embodiment of the invention. FIG. 5 is a front view explaining a method of obtaining a lead insertion angle of the lead in the engagement structure of an electronic component according to the embodiment of the invention.

[Entire Constitution of Engagement Structure of Electronic Component]

Referring now to FIGS. 1A and 1B, an engagement structure of an electronic component includes a printed-wiring board 2 as a circuit board, and an electronic component 3 which is mounted to the printed-wiring board 2 by using an automatic inserting machine (not shown).

(Constitution of Printed-Wiring Board 2)

The printed-wiring board 2, as shown in FIGS. 1A and 1B, is made from a base member having circuit patterns (not shown) formed on its surface and back surface, respectively, and is disposed below the automatic inserting machine. Through holes 20 and 21 (each having a minor diameter of about 3 mm) as plural pairs of connection holes (one pair of connection holes in this embodiment) which are disposed in parallel at predetermined intervals in a surface direction are formed in the printed-wiring board 2. The through holes 20 and 21 are formed by, for example, plating through holes previously formed in the printed-wiring board 2 with copper (Cu). An insulating member such as ceramics or an epoxy resin is used as the base member for the printed-wiring board 2.

(Constitution of Electronic Component 3)

As shown in FIGS. 1A and 1B, the electronic component 3 is composed of a circuit element (not shown) covered with a package 30, and leads 31 and 32 as electrical connection terminals for connection holes which are connected to the circuit element. Also, the electronic component 3 is mounted to a surface (component mounting surface) side of the printed-wiring board 2.

The circuit element, for example, is constituted by a capacitor element such as an electrolytic capacitor, and is electrically and mechanically connected to the through holes 20 and 21 (lands) through the respective leads 31 and 32 by using lead-free solder (not shown) or the like.

As shown in FIGS. 1A and 1B, the leads 31 and 32 are composed of base-side end portions 310 and 320, and claw portions 311 and 321, respectively. Also, the leads 31 and 32 are inserted through the through holes 20 and 21, respectively, with parts thereof being exposed to the outside of the package 30. Also, each of the leads 31 and 32 is entirely formed from an elastically deformable terminal member which has a rectangular shape in cross section and which is made of a conductive material such as brass or phosphor bronze. Since these leads 31 and 32 have approximately the same constitution, one (for example, the lead 31) of them will now be described as follows. That is to say, the base-side end portion 310 of the lead 31 is connected to the circuit element with a part thereof being covered with the package 30, and the claw portion 311 of the lead 31 is engaged with a back surface-side opening periphery of the through hole 20.

As shown in FIGS. 2A and 2B, the base-side end portion 310 is formed in the form of a rectangular piece which has a rectangular shape in cross section, and a thickness and a width of which are set as "b" and "d" in dimension, respectively.

As shown in FIGS. 3 and 4, the claw portion 311 is formed integrally with the base-side end portion 310 so as to protrude to a side opposite to the package 30 side of the base-side end portion 310. The claw portion 311 is provided with a guide portion 312 having a gradient decreasing along a lead insertion direction S, and a retaining portion 313 having a gradient increasing along the lead insertion direction S.

The guide portion 312, as shown in FIGS. 3 and 4, is composed of a leading end portion (first guide surface) 314 and an insertion taper portion (second guide surface) 315. Also, the guide portion 312 is disposed on an outer side surface of the claw portion 311.

As shown in FIGS. 3 and 4, the leading end portion 314 has a lead insertion angle $\beta$ ($\beta=\beta_1, \beta_2, \ldots$) which gradually decreases from the leading end side to the base-side end side of the lead 31. Also, the entire leading end portion 314 is formed so as to have a curved surface which continues from a point $x_0$ to a point $x_1$. Here, the lead insertion angle $\beta$ means an angle which a tangential line at an arbitrary point on the leading end portion 314, and the lead insertion direction make with each other within the same virtual surface. It is noted that the leading end portion 314 may also be formed so as to have an inclined surface having a single lead insertion angle (having a gradient decreasing along the lead insertion direction S).

As shown in FIGS. 3 to 5, similarly to the case of the leading end portion 314, the insertion taper portion 315 is formed so as to have a lead insertion angle (inclined angle) $\theta$ ($\theta=\theta_1, \theta_2, \ldots, \theta_n$: minimum lead insertion angle$\leq \beta$) which gradually decreases from the leading end side to the base-side end side of the lead 31, that is, is formed so as to have a plurality of inclined surfaces (taper portions) $315A_1$, $315A_2, \ldots, 315A_n$ (n=5 in this embodiment) in which the taper angle $\theta$ changes so as to increase along the lead insertion direction S. The inclined surfaces $315A_1, 315A_2, \ldots, 315A_5$ are formed in the form of partial planes which have the gradients "a" ($a=a_1, a_2, a_3, a_4,$ and $a_5$), respectively, (in the form of flat surfaces which have the gradient $a_1$ between the points $x_1$ and $x_2$, the gradient $a_2$ between the points $x_2$ and $x_3, \ldots,$ and the gradient $a_5$ between the points $x_5$ and $x_6$).

Next, a description will now be given with respect to a method of obtaining the lead insertion angle $\theta$ of the insertion taper portion 315 in the lead 31 with reference to FIG. 5. It is noted that since the lead insertion angle $\theta$ of the insertion taper portion 315 in the lead 32 can be obtained in the similar manner to that in the case of obtaining the lead insertion angle $\theta$ of the insertion taper portion 315 in the lead 31, a detailed description thereof is omitted here for the sake of simplicity.

FIG. 5 shows a state in which the electronic component 3 (the lead 31) is inserted into the through hole 20 of the printed-wiring board 2 along the lead insertion direction S by using an insertion force W, so that the insertion taper portion 315 (an arbitrary portion of the inclined surface $315A_5$ in FIG. 5) abuts against an upper opening periphery O.

As shown in FIG. 5, when the lead 31 is inserted into the through hole 20 of the printed-wiring board 2 by using the insertion force W, a deflection load P is applied to the lead 31 in a direction vertical to the lead insertion direction S, and also a frictional force F acts on the lead 31 along the inclined surface $315A_5$. Here, the frictional force F can be expressed by Expression (1):

$$F=OC=\mu \times N \quad (1)$$

where $\mu$ is a coefficient of friction of the frictional force F generated between the lead 31 and the printed-wiring board 2 due to the insertion of the lead 31 into the through hole 20, and N (=OB) is a normal stress acting on an arbitrary portion of the inclined surface $315A_5$ due to the generation of the frictional force F. In addition, the deflection load P can be expressed by Expression (2):

$$P=OA=N \times \cos \theta \quad (2)$$

where $\theta$ is the lead insertion angle which is $\theta_5$ in FIG. 5.

As a result, when the insertion force W for the lead 31 is held at a constant value (W=10N), it is expressed as follows:

$$W = OD + AB \quad (3)$$
$$= F \times \cos\theta + N \times \sin\theta$$

When Expression (1) is substituted into Expression (3), Expression (3) is transformed into Expression (4):

$$W=N \times \cos \theta \times (\mu+\tan \theta) \quad (4)$$

Moreover, when Expression (2) is substituted into Expression (4), Expression (4) is transformed into Expression (5):

$$W=P \times (\mu+\tan \theta) \quad (5)$$

Here, since $\mu<1$, and $P \times \mu^2>0$ are established, a relationship of $W>P \times \mu \times (\mu+\tan \theta)>P \times \mu \times \tan \theta$ is obtained. As a result, the lead insertion angle $\theta$ of the inclined surface $315A_n$ can be obtained from $W=P \times \mu \times \tan \theta$.

Note that, the deflection load P (N/mm) can be obtained from Expression (6):

$$P=b \times d^3 \times E \times Y/4 \times L^3 \quad (6)$$

where b is the thickness (mm) of the lead, d is the width (mm) of the lead, E is the Young's modulus (N/mm$^2$), Y ($Y_n$: a maximum amount of deflection) is an amount (mm) of deflection at a lead abutment point, and L is a dimension (mm) from the package 30 to a lead abutment point.

The retaining portion 313, as shown in FIGS. 3 and 4, is juncturally connected to the insertion taper portion 315 so as to be disposed on an outer side surface (on the same side as that of the guide portion 312) of the claw portion 311.

[Engagement Method for Electronic Component]

An engagement method for an electronic component according to the embodiment of the invention will now be described with reference to FIGS. 1A and 1B.

The electronic component 3 is engaged with the printed-wiring board 2 in such a way that in the state before the lead engagement shown in FIG. 1A, the electronic component 3 is moved downward by using the automatic inserting machine, and the leads 31 and 32 are inserted through the through holes 20 and 21, respectively, from the surface (component mounting surface) side of the printed-wiring board 2 previously placed on the stage by using the load insertion force W (held at a constant value). In this case, when the leads 31 and 32 are inserted through the through holes 20 and 21, respectively, the claw portions 311 and the 321 of the leads 31 and 32 are engaged with the back surface-side opening peripheries of the through holes 20 and 21, respectively, as shown in FIG. 1B. On this occasion, when the insertion of the leads 31 and 32 into the respective through holes 20 and 21 causes the insertion taper portions 315 of the claw portions 311 and 321 to abut against the surface-side opening peripheries (lead abutment start points) of the through holes 20 and 21, respectively, each of the leads 31 and 32 receives the deflection load ($P_n$: maximum deflection load) corresponding to the lead insertion angle θ and the amount, Y, of deflection of the lead in the corresponding one of the insertion taper portions 315 from the corresponding one of the surface-side opening peripheries of the through holes 20 and 21 to undergo a deflection in the direction vertical to the lead insertion direction S.

It is noted that the insertion of the leads 31 and 32 through the respective through holes 20 and 21 starts by the abutment of the insertion taper portions 315 of the claw portions 311 and 312 against the surface-side opening peripheries of the through holes 20 and 21, respectively, and ends by the passing of the retaining portions 313 of the claw portions 311 and 312 through the respective through holes 20 and 21.

After that, in the lead engagement state, the claw portions 311 and 321 of the leads 31 and 32 are soldered to the back surface-side opening peripheries (lands) of the through holes 20 and 21 by using the lead-free solder, respectively, thereby mounting the electronic component 3 to the printed-wiring board 2.

According to the embodiment of the invention as set forth hereinabove, the following effect can be offered.

The leads 31 and 32 can be inserted through the through holes 20 and 21, respectively, by using the insertion force W held equal to or smaller than the predetermined value for the period of time from the start of the insertion of the leads 31 and 32 into the through holes 20 and 21 to the end of the insertion of the leads 31 and 32 through the through holes 20 and 21.

Although the engagement structure of the electronic component of the invention has been described so far based on the embodiment described above, the invention is by no means limited to the embodiment described above, and thus the invention can be implemented in the form of various embodiments without departing from the gist of the invention. For example, changes as will be described below can also be made.

(1) Although in the embodiment, the description has been given with respect to the case where each of the widths of the base side end portions 310 and 320 in the leads 31 and 32 is set as the given dimension d, the invention is by no means limited thereto, and thus each of the widths of the base side end portions may also be set as a changing dimension. That is to say, in a word, any other suitable base-side end portion of the electrical connection terminal for a connection hole of the invention may also be adopted as long as it has a predetermined width.

(2) Although in the embodiment, the description has been given with respect to the case where the connection holes through which the leads 31 and 32 are inserted, respectively, are the through holes 20 and 21, the invention is by no means limited thereto, and thus a recess hole (a connection hole having a closed bottom portion) having a predetermined depth may also be adopted.

(3) Although in the embodiment, the description has been given with respect to the case where the invention is applied to the leads 31 and 32 each having the one-side side surface formed as the flat surface, the invention is by no means limited thereto, and thus each of the one-side side surfaces of the leads 31 and 32, for example, may be formed as a curved surface. Therefore, the invention can also be applied to leads each having one-side side surface formed so as to have any other suitable shape.

(4) Although in the embodiment, the description has been given with respect to the case where the insertion taper portion 315 is formed so as to be composed of a plurality of inclined surfaces $315A_1$, $315A_2$, ... $315A_n$ (n=5 in the embodiment described above), the invention is by no means limited thereto, and thus a guide surface (insertion taper portion) constituted by a continuous curved surface (non-flat surface) having a lead insertion angle which gradually decreases from the leading end portion to the base-side end portion of the lead may also be formed in the claw portion of the lead. In this case, since the insertion taper portion of the lead is formed so as to have the continuous curved surface, in the phase of the lead insertion, the operation for inserting the lead is continuously carried out for the insertion taper portion. As a result, the operation for inserting the lead through the through hole can be smoothly carried out.

(5) Although in the embodiment, the description has been given with respect to the case where the invention is applied to the structure with which the electronic component 3 constituted by the electrolytic capacitor (the capacitor element as the circuit element) is engaged with the printed-wiring board 2, the invention is by no means limited thereto. That is to say, the invention can also be applied to a structure with which an electronic component with leads such as a resistor, a rectifier, a transistor, a fuse or a connector is engaged with the circuit board similarly to the case of the embodiment described above.

What is claimed is:

1. An electrical connection terminal for a connection hole, comprising:
   a base-side end portion having a predetermined width;
   a retaining portion having an increasing width wider than the predetermined width of said base-side end portion, said retaining portion being formed integrally said the base-side end portion;
   an insertion taper portion having a decreasing width narrower than the increasing width of said retaining portion to reach a leading end portion, said insertion taper portion being formed integrally with said retaining portion;
   wherein said insertion taper portion is composed of a plurality of taper portions taper angles of which change so as to increase along an insertion direction, and
   a lead insertion angle θ of said insertion taper portion is designed from W=P×μ×tan θ, and P=b×d3×E×Y/4×L3 so that an insertion force is less than a predetermined force where W is said insertion force (N), P is a deflection load (N/mm), μ is a coefficient of friction, b is a thickness (mm) of said lead, d is a width (mm) of said lead, E is a Young's modulus (N/mm2), Y (Yn: a maximum amount of deflection) is an amount (mm) of deflection at a lead abutment point, and L is a dimension (mm) from a package to a lead abutment point.

2. An electrical connection terminal for a connection hole according to claim 1, wherein a lead as an electrical connection terminal is composed of said base-side end portion, said retaining portion, said insertion taper portion, and said leading end portion, and said lead is formed from an elastically deformable terminal member.

3. An electrical connection terminal for a connection hole according to claim 1, wherein said base-side end portion is formed in a form of a rectangular piece which has a predetermined dimension and which has a rectangular shape in cross section.

4. An electrical connection terminal for a connection hole according to claim 1, wherein a claw portion composed of said retaining portion having a gradient increasing along a lead insertion direction, and a guide portion having a gradient decreasing along the lead insertion direction is formed integrally with said base-side end portion so as to protrude from said base-side end portion.

5. An electrical connection terminal for a connection hole according to claim 4, wherein said guide portion is composed of said leading end portion and said insertion taper portion, and is disposed on an outer side surface of said claw portion.

6. An engagement structure of an electronic component including a circuit board having a connection hole, and an electronic component having an electrical connection terminal for a connection hole which is inserted through said connection hole, said electrical connection terminal for a connection hole being caused to undergo a deflection to be inserted through said connection hole, thereby engaging said electrical terminal for a connection hole with said circuit board, said electrical connection terminal for a connection hole comprising:

a base-side end portion having a predetermined width;
a retaining portion having an increasing width wider than the predetermined width of said base-side end portion, said retaining portion being formed integrally with said base-side end portion;
an insertion taper portion having a decreasing width narrower than the increasing width of said retaining portion to reach a leading end portion, said insertion taper portion being formed integrally with said retaining portion;
wherein said insertion taper portion is composed of a plurality of taper portions taper angles of which change so as to increase along an insertion direction, and
a lead insertion angle θ of said insertion taper portion is designed from W=P×µ×tan θ, and P=b×d3×E×Y/4×L3 so that an insertion force is less than a predetermined force where W is said insertion force (N), P is a deflection load (N/mm), µ is a coefficient of friction, b is a thickness (mm) of said lead, d is a width (mm) of said lead, E is a Young's modulus (N/mm2), Y (Yn: a maximum amount of deflection) is an amount (mm) of deflection at a lead abutment point, and L is a dimension (mm) from a package to a lead abutment point.

7. An engagement structure of an electronic component according to claim 6, wherein a lead as an electrical connection terminal is composed of said base-side end portion, said retaining portion, said insertion taper portion, and said leading end portion, and said lead is formed from an elastically deformable terminal member.

8. An engagement structure of an electronic component according to claim 6, wherein said base-side end portion is formed in a form of a rectangular piece which has a predetermined dimension and which has a rectangular shape in cross section.

9. An engagement structure of an electronic component according to claim 6, wherein a claw portion composed of said retaining portion having a gradient increasing along a lead insertion direction, and a guide portion having a gradient decreasing along the lead insertion direction is formed integrally with said base-side end portion so as to protrude from said base-side end portion.

10. An engagement structure of an electronic component according to claim 9, wherein said guide portion is composed of said leading end portion and said insertion taper portion, and is disposed on an outer side surface of said claw portion.

11. An engagement structure of an electronic component including a circuit board having a through hole, and an electronic component having an electrical connection terminal for a through hole which is inserted through said through hole, said electrical connection terminal for a through hole being caused to undergo a deflection to be inserted through said through hole, thereby engaging said electrical connection terminal for a through hole with said circuit board, said electrical connection terminal for a through hole comprising:

a base-side end portion having a predetermined width;
a retaining portion having an increasing width wider than the predetermined width of said base-side end portion, said retaining portion being formed integrally with said base-side end portion;
an insertion taper portion having a decreasing width narrower than the increasing width of said retaining portion to reach a leading end portion, said insertion taper portion being formed integrally with said retaining portion;
wherein said insertion taper portion is composed of a plurality of taper portions taper angles of which change so as to increase along an insertion direction, and
a lead insertion angle θ of said insertion taper portion is designed from W=P×µ×tan θ, and P=b×d3×E×Y/4×L3 so that an insertion force is less than a predetermined force where W is said insertion force (N), P is a deflection load (N/mm), µ is a coefficient of friction, b is a thickness (mm) of said lead, d is a width (mm) of said lead, E is a Young's modulus (N/mm2), Y (Yn: a maximum amount of deflection) is an amount (mm) of deflection at a lead abutment point, and L is a dimension (mm) from a package to a lead abutment point.

12. An engagement structure of an electronic component according to claim 11, wherein a lead as an electrical connection terminal is composed of said base-side end portion, said retaining portion, said insertion taper portion, and said leading end portion, and said lead is formed from an elastically deformable terminal member.

13. An engagement structure of an electronic component according to claim 11, wherein said base-side end portion is formed in a form of a rectangular piece which has a predetermined dimension and which has a rectangular shape in cross section.

14. An engagement structure of an electronic component according to claim 11, wherein a claw portion composed of said retaining portion having a gradient increasing along a lead insertion direction, and a guide portion having a gradient decreasing along the lead insertion direction is formed integrally with said base-side end portion so as to protrude from said base-side end portion.

15. An engagement structure of an electronic component according to claim 14, wherein said guide portion is composed of said leading end portion and said insertion taper portion, and is disposed on an outer side surface of said claw portion.

* * * * *